United States Patent [19]

Barker, III et al.

[11] Patent Number: 5,597,034
[45] Date of Patent: Jan. 28, 1997

[54] HIGH PERFORMANCE FAN HEATSINK ASSEMBLY

[75] Inventors: Charles R. Barker, III, Harvard; Richard E. Olson; Stephen E. Lindquist, both of Boylston, all of Mass.; Massimo Hartsarich, Kunzelsau, Germany; David A. Cease, Avon; Robert S. Sobolewski, Woodbury, both of Conn.

[73] Assignee: Digital Equipment Corporation, Maynard, Mass.

[21] Appl. No.: 270,193

[22] Filed: Jul. 1, 1994

[51] Int. Cl.$^6$ ........................................... F28F 7/00
[52] U.S. Cl. .................. 165/80.3; 165/121; 165/185; 174/16.3; 257/722; 361/697; 415/211.2
[58] Field of Search ..................... 165/80.3, 185, 165/124, 121, 122; 174/16.3; 257/713, 722; 361/692, 695, 697, 702, 703, 709; 415/211.2

[56] References Cited

U.S. PATENT DOCUMENTS

| | | | |
|---|---|---|---|
| 3,220,471 | 11/1965 | Coe | 165/121 |
| 4,318,693 | 3/1982 | Gutzwiller | 415/211.2 |
| 4,634,342 | 1/1987 | Rodewald | 415/211.2 |
| 4,715,438 | 12/1987 | Gabuzda et al. | 165/185 |
| 4,733,293 | 3/1988 | Gabuzda | 257/722 X |
| 4,823,869 | 4/1989 | Arnold et al. | 165/185 |
| 4,918,571 | 4/1990 | Grabbe | 257/722 X |
| 4,997,034 | 3/1991 | Steffen et al. | 165/122 X |
| 5,019,880 | 5/1991 | Higgins, III | 165/80.3 |
| 5,132,780 | 7/1992 | Higgins, III | 257/722 |
| 5,240,373 | 8/1993 | Mita et al. | 415/211.2 |

FOREIGN PATENT DOCUMENTS

| | | | |
|---|---|---|---|
| 2508727 | 9/1976 | Germany | 165/125 |
| 4231122 | 7/1993 | Germany | 257/722 |

*Primary Examiner*—Leonard R. Leo
*Attorney, Agent, or Firm*—Denis G. Maloney; Arthur W. Fisher

[57] ABSTRACT

A fan heatsink assembly is provided to afford cooling for electronic components mounted on a circuit board. The assembly includes a blower mounted on top of a specially shaped heatsink, the heatsink having a truncated hyperbolic shaped central member, with fins radially emanating from the center. The blower draws air in through the area between the fins, up the curved central portion and into the blower assembly where it is then exited out the sides of the fan. The fins may be smooth or textured, straight or curved. The fan heatsink assembly is attached to the device to be cooled. Heat is transferred from the electronic component, into the heat dissipating member where the fan causes air to be drawn up between the fins and along the curved center portion, removing heat from the heat dissipating member and the electronic component.

4 Claims, 4 Drawing Sheets

HIGH PERFORMANCE FAN HEATSINK ASSEMBLY

BACKGROUND OF THE INVENTION

This invention relates generally to cooling of electronic components and, more particularly to the cooling of electronic devices by heatsinks.

As is known in the art electronic components such as solid state devices dissipate power as heat. As the density and speed of modern solid state devices such as integrated circuits increases, the heat per area produced by these devices also increases. Without proper cooling of the solid state device junction temperatures of the device increase beyond the design specification which can result in thermal and chemical breakdown of the device.

One prior attempt to cool such devices was to place the components in a computer cabinet which was cooled by fans mounted in the cabinet and disposed so they would blow air across a circuit board on which the components were mounted. Often these components had passive heatsinks attached to the devices which dissipated high amounts of power. This passive heatsinking solution is inadequate for those applications requiring components which now dissipate more power than can be effectively cooled in this manner.

Previous attempts to cool higher power components by an active means have included employing liquid nitrogen cooling for the entire circuit board, the use of a self-contained evaporator and condenser apparatus coupled directly to the component or the positioning of a tube axial fan directly over a conventional heatsink directly coupled to the component. All of these implementations suffer serious drawbacks. The liquid nitrogen cooling is expensive, requires additional space and plumbing and lowers the mean time between failures of the system. The use of a self-contained evaporator and condenser apparatus also suffers from being expensive to implement as well as requiring additional space.

On the other hand the use of a tube axial fan mounted directly to a conventional heatsink, while effective for earlier applications, suffers from having it's lowest thermal resistance at the periphery of the heatsink, rather than the center of the heatsink where most of the component's power is actually dissipated. This problem results from having low airflow velocities directly behind the hub of the tube axial fan which is located over the center of the heatsink. In operation of such a heatsink arrangement the motion of the fan blades of the fan provide a wake or disturbance around the center hub which mitigates the amount of air flow available at the center of the fan heatsink assembly. Since the center of the heatsink is located over the hottest part of the component and is located in the lowest air flow part of the fan, the wake produced by the center hub of the tube axial fan, the heatsink performance of this implementation is degraded. The cooling actually takes place at the periphery of the heatsink resulting in a low overall efficiency because the heat is now spread along the outer edges fins in order to be effectively cooled.

SUMMARY OF THE INVENTION

In accordance with the present invention a fan heatsink assembly includes a heat dissipating member which has a base and a truncated hyperbolic shaped central portion over a central portion of the base. Also included on the base are a series of fins radiating from the center portion, some of the fins extending from the top of the central member to the edge of the base and some of the fins extending from a point approximately half way along the sidewall of the central member to the edge of the base. Mounted above the heat dissipating member is a blower assembly oriented in such a manner that air is drawn in at the base of the heat dissipating member, up through the gaps between the fins, into the bottom of the blower assembly and exited out the sides of the blower. The fan heatsink assembly is thermally coupled to an electronic component which in turn is mounted to a circuit board. With such an arrangement, by providing the heat dissipating member with a base having a truncated hyperbolic shaped central portion, turbulence over the central portion of the member are increased reducing the wake effect of prior techniques and providing for more efficient heat dissipation.

DESCRIPTION OF PREFERRED EMBODIMENTS

Figure 1:
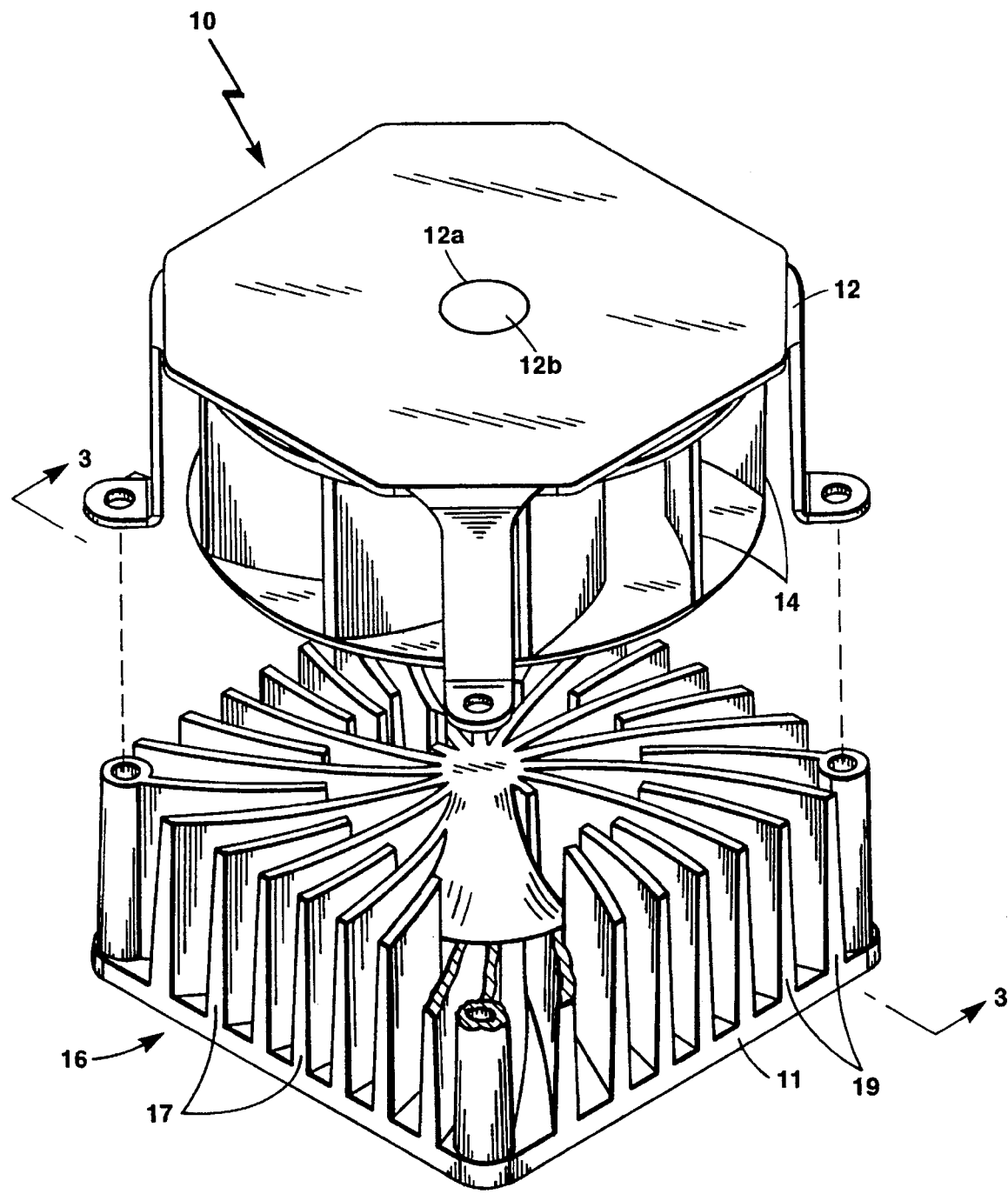
FIG. 1 is an exploded isometric view of the high performance fan heatsink assembly with a portion of the front fins cut away.

Referring now to FIGS. 1–5 a fan heatsink assembly 10 is shown to include a fan member 12 having a motor 12a disposed in the center of the fan as is shown about a hub portion 12b and blades 14 disposed about the hub. The blades are conventional and can be either curved or straight. The fan heatsink assembly further includes a heat dissipating member 16 comprised of a suitable thermal conducting material such as aluminum, copper or a thermal alloy. The blower portion 12 of the assembly is connected to the top of the heat dissipating member 16 by a plurality of screws or by any other suitable attachment means.

The fan heatsink assembly 10 is shown attached to an electronic component 13a (FIG. 2) which is in turn mounted to a circuit board 13b. The heat dissipating member 16 is coupled to the heat producing electronic component 13a in this instance by placing the heat dissipating member 16 on top of the component 13a and affixing center-tapped rods 24 onto the threaded studs 22 (FIG. 3) extending from the top of the electronic component through holes 21 (FIG. 5) in the heat dissipating member 16. In this manner the heat dissipating member 16 is securely attached to the electronic component 13a. There may also be a thermal gasket (not shown) inserted between the heat dissipating member 16 and the component 13a to ensure that a good thermal bond results. The attachment of the heatsink assembly 10 to the electronic component 13a could also be accomplished by use of a thermal epoxy, clips or any other means of attaching heatsinks that provides for a thermally conductive bond between the component 13a and the fan heatsink assembly 10.

Figure 4:
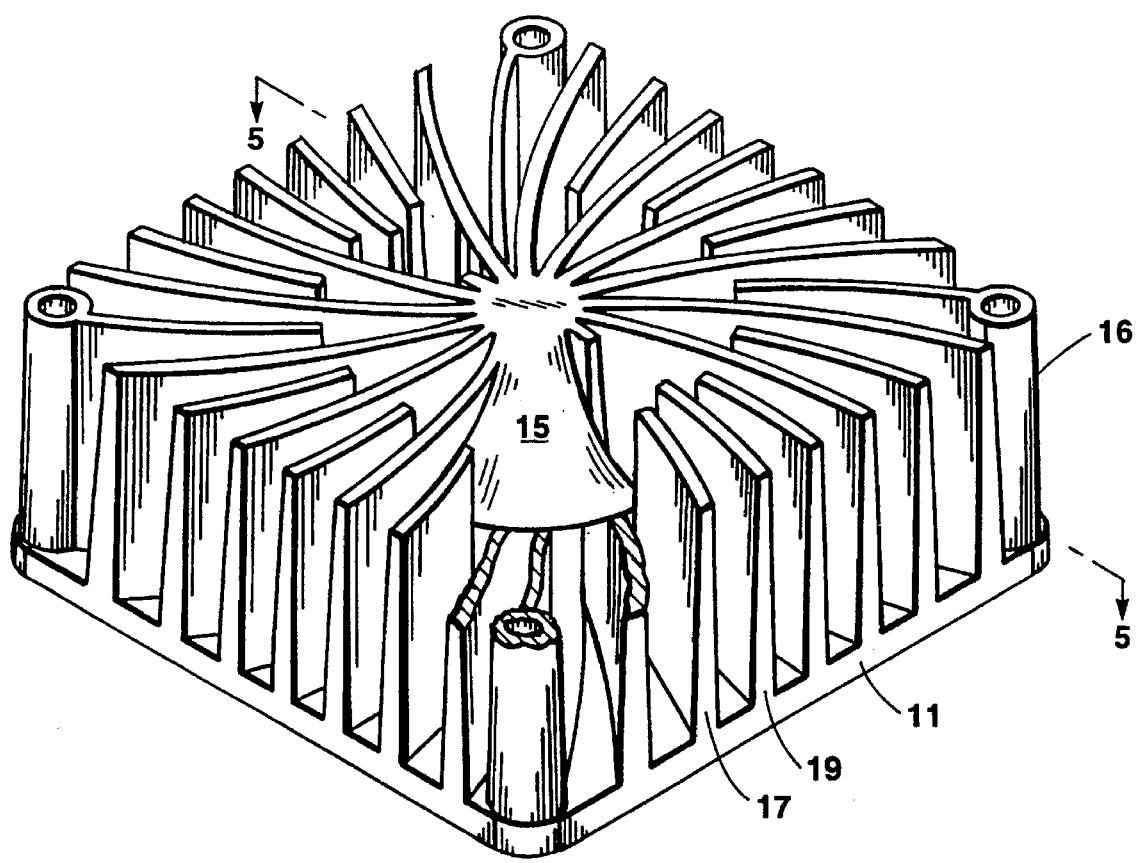
FIG. 4 is an isometric view of a heatsink used in the fan heatsink of FIG. 1 with a portion of the front fins cut away.
Figure 5:
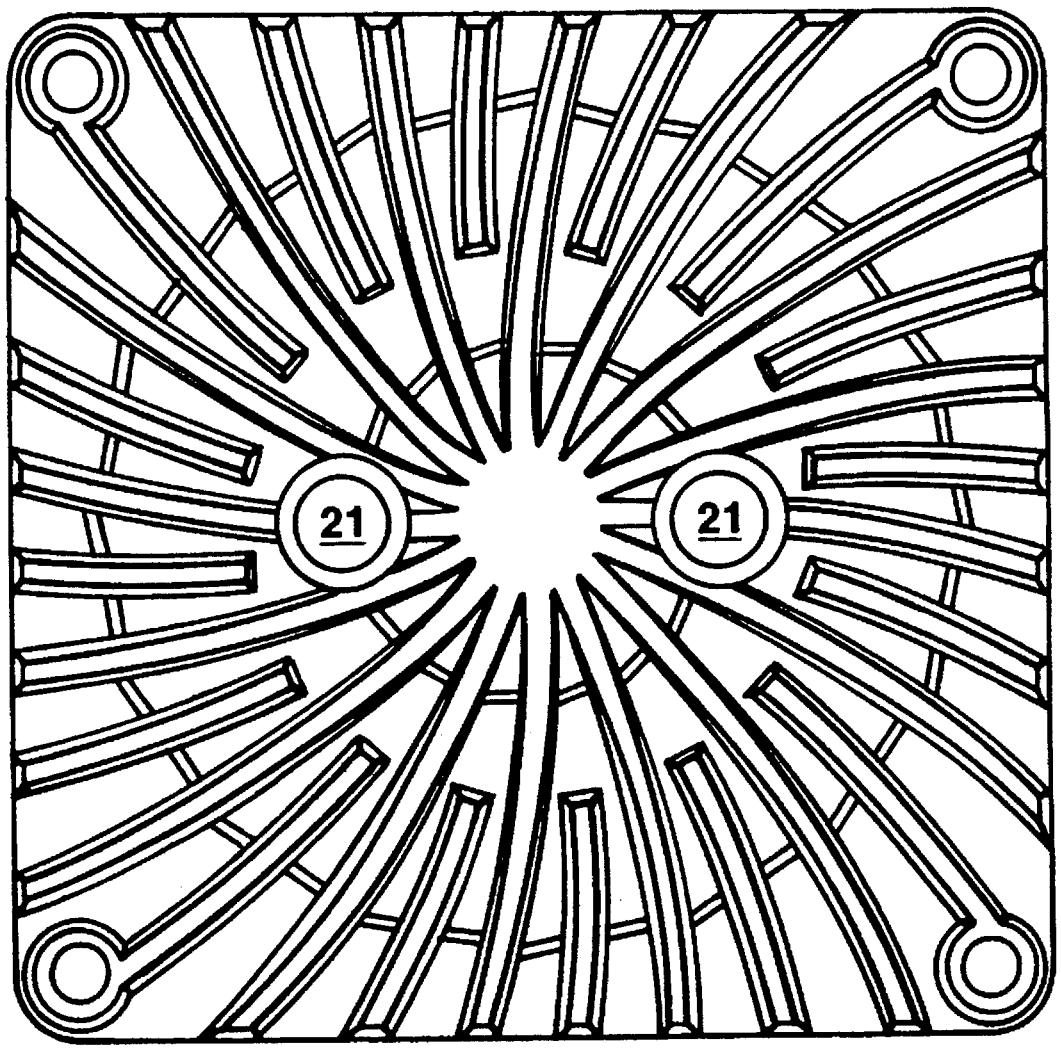
FIG. 5 is a top view of the heatsink taken along line 5—5 of FIG. 4.

Referring now in particular to FIG. 4 the heat dissipating member 16 is shown to include a truncated hyperbolic shaped central member 15 and first and second pluralities of fins 17 and 19 respectively. The first plurality of fins 17 are disposed between the periphery of the heat dissipating member 16 and intersect with the truncated hyperbolic shaped central member 15 of the heatsink assembly. The heat dissipating member 16 includes the second plurality of fins 19 disposed between corresponding pairs of the first plurality of fins 17, and which extend between the periphery of the heat dissipating member 16 and a portion of the truncated hyperbolic shaped central member 15. Here the second plurality of fins 19 extend from the periphery of the heat dissipating member 16 to approximately half way up the side wall of the truncated hyperbolic shaped central member 15. The thickness of the fins 17 and 19 is dependent on the amount of cooling needed by the electronic component 13b with a thicker fin providing more heat transfer since a thicker fin will have lower thermal resistance as opposed to a thinner fin. In this embodiment the fins are 1.5 millimeters thick.

As shown in FIG. 1, in this embodiment the fins 17 and 19 are curved in order to produce a swirling of the air. As the air enters at edges of the base 11 of the heat dissipating member 16, the air is drawn up and into the blower assembly 12 through gaps between the first and second pluralities of fins 17 and 19. By pulling air into the heatsink the maximum air velocity occurs over the center of the electronic component 13a, where the maximum cooling is required. In this manner high heat transfer rates occur directly over the highest heat flux area of the electronic component 13a.

Due to the curved nature of the fins 17 and 19 the air is swirled as it enters the blower assembly 12. This swirling of the air produces two effects, either of which is advantageous. The first effect is an augmentary effect in which the resulting swirled air is in the same direction as the air movement caused by the fan resulting in a larger volume of air being moved through the assembly. The second effect is a fighting effect in which the resulting swirled air is in the opposite direction as the air movement caused by the fan. In the fighting swirl case the resulting swirled air is in the opposite direction of the air movement produced by the blower assembly 12 and results in high turbulence which produces a higher pressure differential and results in more cooling. Other embodiments may have fins radiating straight out from the central member 15 as opposed to curved so that no resulting swirl is obtained. In this embodiment the fins 17 and 19 have a smooth surface to allow for maximum air flow. Other embodiments may have fins with a textured surface producing secondary flows in response to air passing over the textured area, causing the formation of reattached boundary layers and resulting in increased cooling.

The blower assembly 12 used in this embodiment is a reverse curved blower. This blower assembly 12 operates by drawing air in from underneath the blower assembly 12 and pushing it out the sides of the assembly. Other implementations may use a radial blower or a mixed flow blower. The electrical power required to run the blower assembly 12 is here derived from the circuit board by a power harness extending from the blower assembly 12 to a connector on the circuit board 13b or any other electrical source readily available.

Figure 2:
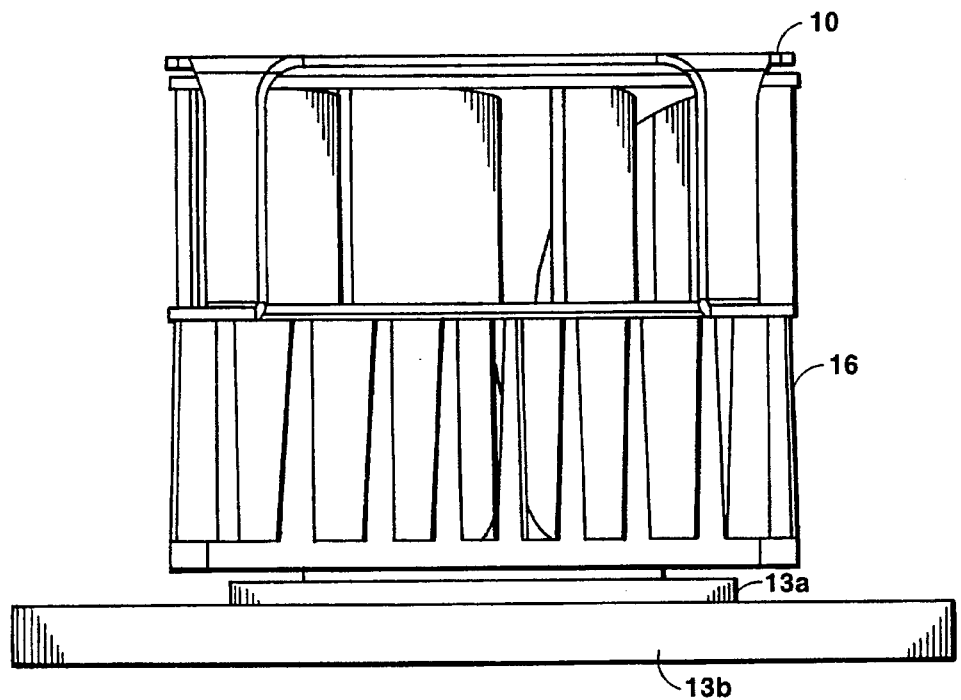
FIG. 2 is a side view of the fan heatsink assembly of FIG. 1 mounted to a semiconductor device which is mounted to a circuit board.
Figure 3:
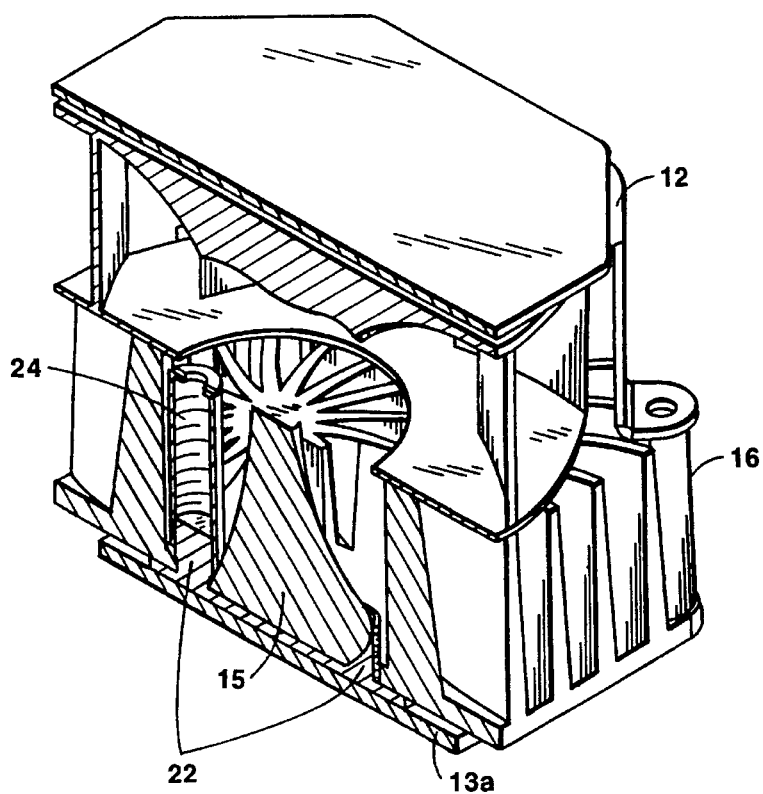
FIG. 3 is an isometric cross sectional view taken along line 3—3 of FIG. 1 with a second center-tapped rod not shown.

Referring now in particular to FIG. 2 the fan heatsink assembly is shown coupled to the component 13a which in turn is attached to a circuit board 13b. The blower assembly 12 draws air in from the edges of the base of the fan heatsink assembly 10. The air is moved from the bottom of the heat dissipating member 16 between the fins 17 and 19 along the sidewall of the truncated hyperbolic shaped central member 15 and up into the bottom of the blower assembly 12 where it exits out the sides of the blower 12. In this manner the heat is drawn away from the component 13a and into the thermally bonded heat dissipating member 16. The fins 17 and 19 direct the heat away from the electronic component 13a and are cooled by the air moving over them. The cooling is a result of a combination of air flow and turbulence. There are various modifications which can be provided to increase the airflow or the turbulence. The use of the previously mentioned curved fins 17 and 19 as opposed to straight fins increases the air flow by producing swirl though straight fins could be used if an increase in the volume of air being moved is not a factor. The use of smooth fins allows for more air flow. The use of textured or ribbed fins increases cooling of the fin through reduced boundary layer thickness and increased secondary flows.

An additional benefit derived from using this type of blower assembly 12 is that there is no requirement for air space above the blower assembly 12, thus a cover could be positioned directly above the blower assembly 12 as could additional circuit boards, I/O devices or other parts of a computer system.

Additional controls could be part of the blower assembly 12 such as a tachometer output so that, in the case of a blower assembly failure, action could be taken such as shutting down of the system so that the component 13a is not subjected to being thermally over stressed. There also exists the possibility of a fan speed control circuit so that the fan spin rate is determined by the temperature of the component or the temperature of the ambient air around the component. Additionally, since the air exiting the blower assembly is parallel to the surface of the circuit board it is possible to use shrouds and baffles to direct this departing air over other components located nearby to give them additional cooling, for example if a CPU component was being cooled by this invention then the air exiting the blower could be diverted to cool cache rams which are typically positioned close to the CPU device.

Having described preferred embodiments of the invention it will now become apparent to those of ordinary skill in the art that other embodiments incorporating these concepts may be used. Accordingly it is submitted that the invention should not be limited to the disclosed embodiments but rather should be limited only by the spirit and scope of the appended claims.

What is claimed is:

1. A heatsink assembly comprising:

a heat dissipating member including a base, a truncated conical shaped central member disposed over a central portion of said base, and a plurality of fins supported on said base, wherein said plurality of fins comprises a first plurality of fins extending from a top of said central member to the periphery of said heat dissipating member interposed with a second plurality of fins extending from the periphery of said heat dissipating member to a portion of a sidewall of said central member.

2. A fan heatsink assembly comprising:

a heat dissipating member including a base, a truncated conical shaped central member disposed over a central portion of said base, wherein said central member maybe a truncated hyperbolic shade, and a plurality of fins supported on said base; and a fan assembly directly mounted on said heat dissipating member, wherein said plurality of fins comprises a first plurality of fins extending from said central member to the periphery of said heat dissipating member interposed with a second plurality of fins extending from the periphery of said heat dissipating member to a portion of a sidewall of said central member.

3. The heatsink assembly of claim 2 wherein said plurality of fins are curved.

4. The heatsink assembly of claim 2 wherein said plurality of fins are straight.

* * * * *